United States Patent [19]
Romesburg et al.

[11] Patent Number: 5,742,191
[45] Date of Patent: Apr. 21, 1998

[54] D/A FOR CONTROLLING AN OSCILLATOR IN A PHASE LOCKED LOOP

[75] Inventors: Eric Douglas Romesburg, Chapel Hill, N.C.; Mark Francis Rumreich, Indianapolis, Ind.

[73] Assignee: Thomson Consumer Electronics, Inc., Indianapolis, Ind.

[21] Appl. No.: 647,981

[22] PCT Filed: Dec. 8, 1993

[86] PCT No.: PCT/US93/11996

§ 371 Date: Jun. 4, 1996

§ 102(e) Date: Jun. 4, 1996

[87] PCT Pub. No.: WO95/16309

PCT Pub. Date: Jun. 15, 1996

[51] Int. Cl.⁶ .................................................. H03L 7/06
[52] U.S. Cl. .......................... 327/156; 327/157; 327/159; 348/505; 348/512; 331/1 A
[58] Field of Search ........................ 327/105, 106, 327/107, 156–159; 331/1 A, 17, 25, DIG. 2; 375/376; 348/505–508, 512–514, 516, 528, 536, 639

[56] References Cited

U.S. PATENT DOCUMENTS

| | | | |
|---|---|---|---|
| 3,946,323 | 3/1976 | Bjerede | 375/376 |
| 4,488,170 | 12/1984 | Nillesen | 358/26 |
| 4,700,217 | 10/1987 | Balaban et al. | 358/23 |
| 4,745,372 | 5/1988 | Miwa | 331/8 |
| 4,791,378 | 12/1988 | Waltham | 327/156 |
| 4,802,009 | 1/1989 | Hartmeier | 375/376 |
| 4,862,105 | 8/1989 | Walbrou et al. | 331/1 |
| 4,884,040 | 11/1989 | Fling | 331/1 |
| 5,159,292 | 10/1992 | Canfield et al. | 331/1 |
| 5,373,255 | 12/1994 | Bray et al. | 327/159 |
| 5,459,766 | 10/1995 | Huizer et al. | 375/376 |

*Primary Examiner*—Timothy P. Callahan
*Assistant Examiner*—Kenneth B. Wells
*Attorney, Agent, or Firm*—Joseph S. Tripoli; Joseph J. Laks; Sammy S. Henig

[57] ABSTRACT

A phase-lock-loop circuit includes a digital-to-analog converter of the bit rate multiplier type. The input word to the converter is updated once each horizontal period of a television signal. Phase information contained in an output signal of the bit rate multiplier is obtained in one horizontal period and is retained for affecting the phase in the immediately following horizontal period.

11 Claims, 2 Drawing Sheets

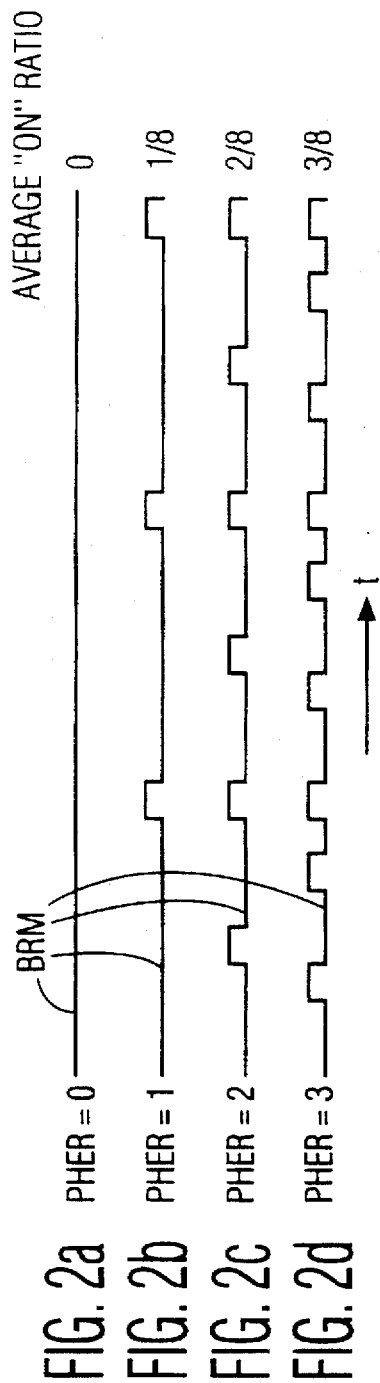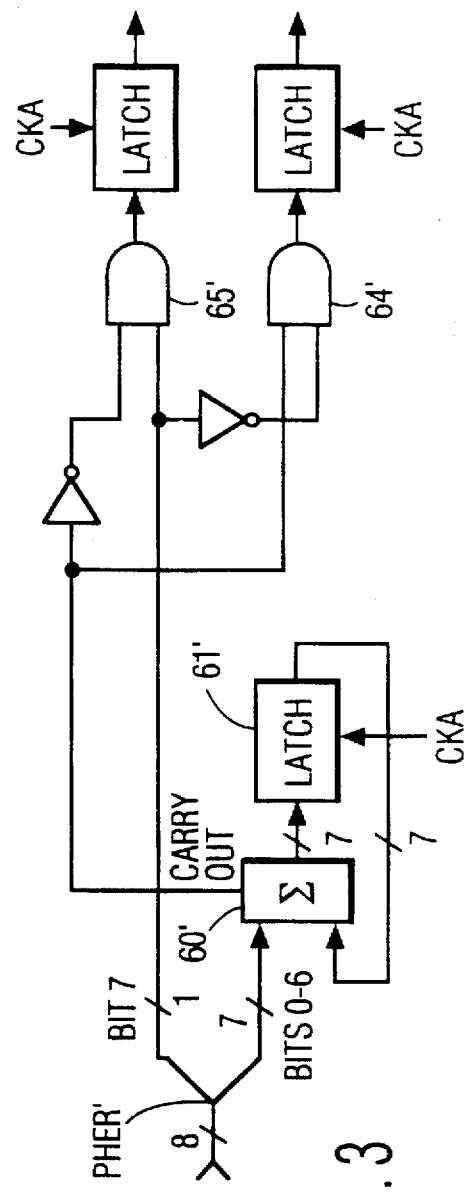

D/A FOR CONTROLLING AN OSCILLATOR IN A PHASE LOCKED LOOP

This invention relates to Phase Locked Loops (PLL's), and more particularly to apparatus for generating a phase/frequency control signal of a controllable oscillator in the feedback loop.

Phase Locked Loops are circuits well known in the communications arts, for synchronizing a variable local oscillator with the phase and/or frequency of a component of a transmitted signal. Typically such circuitry includes a phase detector which is responsive to the transmitted signal and the output of the local oscillator, to generate a phase error signal proportional to the difference between a component of the transmitted signal and the oscillator output. The phase error signal is coupled to control the oscillator rate of the variable oscillator.

U.S. Pat. No. 5,159,292 in the names of Canfield, et al., entitled, ADAPTIVE PHASE LOCKED LOOP describes a PLL for synchronizing a voltage controlled oscillator (VCO) to a subcarrier burst component in each active horizontal line of a composite video signal. A phase error signal digitally represented as a parallel phase error data word is applied via a digital-to-analog (D/A) converter to produce an analog signal having a magnitude that is determined by the value of the phase error data word. The analog signal that undergoes signal integration process is applied to control the phase/frequency of the VCO.

In one prior art, such D/A converter is realized using a pulse-width-modulator (PWM). During each horizontal line, the PWM generates a single pulse, when phase correction is required, having a pulse width that is modulated in accordance with the value of the phase error data word. The modulated pulse is applied to a charge pump arrangement. The charge pump arrangement charges/discharges an integrating capacitor, during the pulse. The change in the capacitor voltage is determined by the pulse width or the value of the phase error word. The capacitor voltage controls the VCO frequency. Disadvantageously, because only a single pulse occurs during each horizontal line, the size of the integrating capacitor may be relatively large.

For reducing the size of the integrating capacitor, a bit rate multiplier, embodying an inventive feature, is utilized as the D/A converter. The bit rate multiplier produces pulses at a higher frequency than the horizontal frequency. The bit rate multiplier includes a memory. The memory retains phase information of the pulses from each horizontal line to the immediately following one. Such an arrangement prevents errors in the analog output signal.

A phase locked loop circuit, embodying an aspect of the invention, generates an oscillatory signal phase locked to a synchronizing component signal of an input signal. A controllable oscillator generates the oscillatory signal. A phase error signal that is indicative of a phase error of the oscillatory signal is generated. A first control signal having pulses of equal pulse width and a frequency that varies in accordance with a magnitude of the phase error signal are generated. A filter responsive to the first control signal generates a filtered control signal that is coupled to the oscillator for varying a phase of the oscillatory signal.

FIGS. 2a–2d illustrate waveforms useful for explaining the operation of the converter of FIG. 1; and FIG. 3 illustrates a second embodiment of the converter of FIG. 1.

Figure 1:
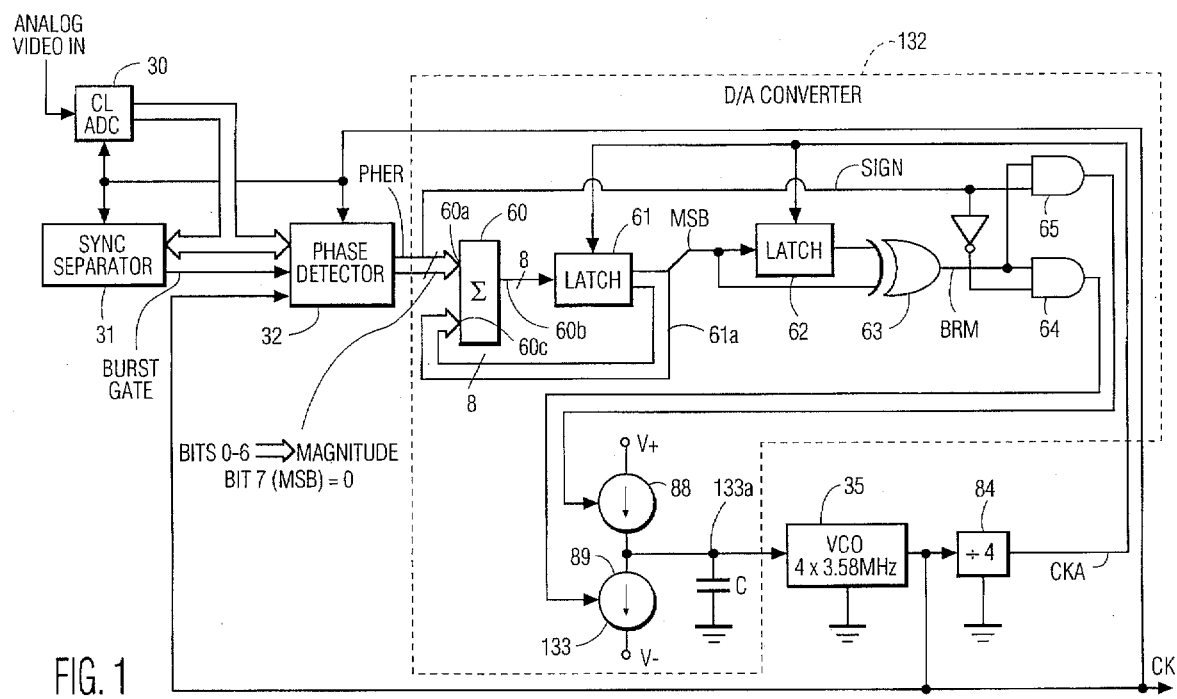
FIG. 1 illustrates a phase-lock-loop circuit including a digital-to-analog converter, embodying an aspect of the invention.

Referring to FIG. 1, an analog video signal from, for example, a television tuner, not shown, is applied to an analog-to-digital converter (ADC) 30. A digitized version of the analog signal is coupled from the output of the ADC to a horizontal synchronizing signal separator 31 and a phase detector 32. Separator 31 produces horizontal synchronizing pulses, which are coupled to phase detector 32, to condition the phase detector to operate in a phase measuring mode during chrominance reference burst intervals. Phase detector 32 is responsive to the digitized video signal compared in phase detector 32 to generate a phase error signal PHER. Signal PHER is, for example, an 8 bit binary word having, for example, a sign-magnitude format.

Signal PHER is coupled to a D/A converter 132, embodying an aspect of the invention, that includes a charge-pump 133. Charge-pump 133 charges/discharges an integrating capacitor C for producing an analog signal 133a in capacitor C. Signal 133a is used for controlling the relative phase of a voltage controlled oscillator (VCO) 35. Finally the VCO 35 generates a master clock signal CK at four times the subcarrier frequency, for example, for operating the other circuit elements. In the NTSC standard, such frequency is equal to 4×3.58 MHz. In particular the timing of the pulses of the master clock signal determine the instances at which the ADC 30 develops digital samples of the analog signal.

The way binary word signal PHER is generated may be similar to that described in the Canfield, et al., patent. Signal PHER is updated once each horizontal line period H at a predetermined instant controlled by a signal BURST GATE produced in separator 31. Signal BURST GATE is indicative of the occurrence of the burst signal component.

Seven magnitude bits of binary signal PHER, bits 0–6, are coupled to an input port 60a of a binary adder 60, with the 8th bit, that is the most significant bit, being zero. An 8-bit output signal 60b of adder 60 is coupled to an input port of a memory or latch 61. Latch 61 is updated once each period of a clock signal CKA. An output binary word signal 61a of latch 61 having 8 bits is coupled back to an input port 60c of adder 60. Signal 61a is equal to the sum of the magnitude portion of signal PHER and signal 61a.

A most significant bit signal MSB of signal 61a is coupled to a one-bit latch 62. Both latch 61 and latch 62 are clocked at a frequency of output clock signal CKA. Clock signal CKA has a period of approximately 280 nSec and is produced by a divide-by-four frequency divider 84 from signal CK.

Signal MSB is coupled delayed, by the period of signal CKA, and undelayed to corresponding inputs of an Exclusive-OR gate 63 to produce bit rate multiplied signal BRM. Latch 62 and gate 63 produce signal BRM at the active HIGH state throughout the period of signal CKA following a change in state of signal MSB. If no state change occurs in signal MSB, signal BRM, in the following period of signal CKA, is at the inactive or LOW state. For a given number of magnitude bits, N, that is equal to 7 in the example of FIG. 1, the maximum period of signal BRM is equal to $2^N$ periods of clock signal CKA.

In a first example, representing an extreme case, the phase error signal PHER is at a minimum magnitude with all the bits being at the LOW state. In this case, that is indicative of a zero phase error, word signal 60b remains constant in each period H and there is no change in signal MSB. Therefore, signal BRM is maintained at the inactive, LOW state.

In a second example, representing the other extreme case, assume that signal PHER is at its maximum value, or all the magnitude bits are at the HIGH state. This ease represents magnitude value of 127 and is indicative of a maximum phase error. In this case, signal MSB will change states in each but one of every 128 consecutive periods of signal CKA because of the "wrapping" operation of adder 60. Therefore, signal BRM is maintained at the HIGH state in all but one of each of the 128 periods of signal CKA.

In a third example, assume, for explanation purposes, that the value of the magnitude bits of signal PHER is equal to 64 or one half the maximum magnitude that can be represented by signal PHER. In this case, signal BRM will alternate between the HIGH and LOW states following every period of signal CKA. The result is that, for a given interval such as the period H, the average "on" ratio between the times when signal BRM is at the HIGH state and the period H is proportional to the magnitude of signal PHER.

FIGS. 2a–2d illustrate four examples of the frequency of signal BRM resulting from signal PHER having magnitudes 0, 1, 2 and 3, respectively. For illustration purposes, FIGS. 2a–2d correspond to an arrangement that is similar to that in FIG. 1 except that the number of magnitude bits, N, is equal to 3 instead of 7 as in the example of FIG. 1. Similar symbols and numerals in FIGS. 1 and 2a–2d indicate similar items or functions.

When the magnitude of signal PHER of FIG. 2d is 3, the average "on" ratio in a given interval, between the times when signal BRM is at the HIGH state and the period H is three-eighths. Such ratio corresponds to the ratio $3/2^N$, where N=3 represents the number of magnitude bits.

As explained before, signal PHER of FIG. 1 is updated once each horizontal line period H. However, updating signal PHER is not accompanied by initialization of latch 61. Therefore, latch 61 contains phase information of signal BRM that is carried over from one horizontal period H to the immediately following one.

In accordance with an inventive feature, by carrying over the phase information of signal BRM and not initializing latch 61, the aforementioned average "on" ratio is made independent of a ratio between a maximum period of signal BRM, that is equal to 128 periods of signal CKA for 7 bits, and the period between consecutive updating of signal PHER, that is equal to horizontal period H. It can be shown that when the updating period such as period H is not equal to an integer multiple of the maximum period of signal BRM, initialization of latch 61 in each updating period H could introduce an error in analog signal 133a.

FIG. 3 illustrates a second embodiment of a portion of D/A converter 132 of FIG. 1. Similar symbols and numerals in FIGS. 1, 2a–2d and 3 indicate similar items or functions except for the prime symbol. In FIG. 3, signal PHER' is represented as a two's complement number rather than a sign-magnitude. Signal BRM' is obtained as a carry out signal of adder 60'.

When signal BRM of FIG. 1 is at the HIGH state and a signal SIGN, that represents the sign of signal PHER, is at the HIGH state, an AND gate 65 enables a positive current source 88 to charge capacitor C. On the other hand, when signal SIGN is at the LOW state and signal PHER is at the HIGH state, an AND gate 64 enables a negative current source 89 to discharge capacitor C. As long as signal BRM is at the LOW state, both current sources 88 and 89 are disabled and capacitor C is neither charged nor discharged. The frequency of signal BRM is higher than the horizontal frequency when, for example, the magnitude of the phase error signal PHER is large. Therefore, advantageously, the size of capacitor C need not be as large as in a prior art arrangement in which the D/A converter operates as a pulse-width modulator type instead of, as in the arrangement of FIG. 1, as a bit rate multiplier.

For a given value of capacitor C, the peak-to-peak VCO control voltage ripple can be reduced. Smaller ripple leads to more consistent clock frequency over the horizontal line period or less distortion of tint. This scheme also provides more freedom to choose an integration capacitor based on the desired bandwidth of the loop, since it has less filtering to do concerning ripple on the VCO control voltage. In this way, the loop can be made faster without sacrificing VCO control voltage ripple.

We claim:

1. A phase locked loop circuit for generating an oscillatory signal phase locked to a synchronizing component signal of an input signal, comprising, a controllable oscillator for generating said oscillatory signal;

means responsive to said component and oscillatory signal for generating a phase error signal that is indicative of a phase error of said oscillatory signal;

means responsive to said phase error signal for generating a first control signal having pulses at a variable frequency that varies in accordance with a magnitude of said phase error signal; and a filter responsive to said first control signal for generating a filtered control signal that is coupled to said oscillator for varying a phase of said oscillatory signal.

2. A phase locked loop circuit according to claim 1 wherein said error signal is represented in a digital format and wherein said first control signal generating means comprises a bit rate multiplier.

3. A phase locked loop circuit according to claim 2 wherein said bit rate multiplier is coupled to a charge pump arrangement to form a digital-to-analog converter.

4. A phase locked loop circuit according to claim 2 wherein said first control signal generating means comprises an accumulator responsive to a clock signal for accumulating data of said error signal at a rate that is determined by a rate of said clock signal and means responsive to an accumulated data signal in said accumulator for generating a given pulse of said first control signal when said accumulated data signal is at a predetermined magnitude.

5. A phase locked loop circuit according to claim 4 wherein said error signal is updated in steps that occur periodically and wherein said accumulator combines the updated error signal that is applied to said accumulator following a given updating step with the accumulated data signal contained in said accumulator that is obtained prior to said updating step without initializing said accumulated data signal.

6. A phase locked loop circuit according to claim 5 wherein the absence of initialization of said accumulated data signal reduces a dependency of said filtered control signal on a ratio between a length of an interval between updating steps and a period of said first control signal.

7. A phase locked loop circuit according to claim 5 wherein said error signal is updated once during a horizontal period of a television signal.

8. A phase locked loop circuit according to claim 1 wherein said pulses have equal width when said phase error signal is within a range of values.

9. A phase locked loop circuit for generating an oscillator signal phase locked to a synchronizing component signal of an input signal, comprising:

a controllable oscillator for generating said oscillatory signal;

means responsive to said component and oscillatory signals for generating a phase error signal that is indicative of a phase error of said oscillatory signal and that is periodically updated in steps in accordance with a clock signal;

means responsive to said updated phase error signal for generating a first control signal having pulses at a frequency that varies in accordance with said updated phase error signal such that a phase of said pulses following a given updating step is determined by both said updated phase error signal that is associated with said given updating step and said updated phase error signal that is associated with a preceding updating step; and a filter responsive to said first control signal for generating a filtered control signal that is coupled to said oscillator for varying a phase of said oscillatory signal.

10. A phase locked loop circuit according to claim 9 wherein said pulses are of equal pulse width.

11. A phase locked loop circuit for generating an oscillatory signal phase locked to a synchronizing component signal of an input signal, comprising:

a controllable oscillator for generating said oscillatory signal;

a phase detector responsive to said component and oscillatory signals for generating a phase error signal that is indicative of a phase error of said oscillatory signal;

a rate multiplier responsive to said phase error signal for generating a first control signal having a frequency determined by a magnitude of said phase error signal; and a filter responsive to said first control signal for generating a filtered control signal that is coupled to said oscillator for varying a phase of said oscillatory signal.

* * * * *